United States Patent
Whangbo et al.

(10) Patent No.: US 8,785,934 B2
(45) Date of Patent: Jul. 22, 2014

(54) THIN FILM TRANSISTOR SUBSTRATE FOR DISPLAY PANEL

(71) Applicant: Samsung Display Co., Ltd., Yongin (KR)

(72) Inventors: Sang-Woo Whangbo, Seoul (KR); Shi-Yul Kim, Yongin-si (KR); Sung-Hoon Yang, Seoul (KR); Woo-Geun Lee, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/677,176

(22) Filed: Nov. 14, 2012

(65) Prior Publication Data

US 2013/0070176 A1    Mar. 21, 2013

Related U.S. Application Data

(62) Division of application No. 11/646,126, filed on Dec. 27, 2006, now Pat. No. 8,647,928.

(30) Foreign Application Priority Data

Dec. 28, 2005   (KR) .................. 10-2005-0131967

(51) Int. Cl.
*H01L 29/04*   (2006.01)
*H01L 29/10*   (2006.01)

(52) U.S. Cl.
USPC ............................................. 257/57; 257/66

(58) Field of Classification Search
USPC .......... 257/57, 59, 66, 72, E21.414, E29.291, 257/E29.294
See application file for complete search history.

(56) References Cited

U.S. PATENT DOCUMENTS

| | | | |
|---|---|---|---|
| 5,677,211 A | 10/1997 | Kaneko | |
| 6,188,452 B1 * | 2/2001 | Kim et al. | 349/43 |
| 6,566,174 B1 | 5/2003 | Takechi et al. | |
| 7,411,298 B2 * | 8/2008 | Kawakami et al. | 257/741 |
| 2004/0183072 A1 | 9/2004 | Kim et al. | |
| 2004/0198046 A1 | 10/2004 | Yu-Chou et al. | |
| 2006/0240602 A1 | 10/2006 | Roca I Cabarrocas et al. | |

FOREIGN PATENT DOCUMENTS

| | | |
|---|---|---|
| CN | 1243603 | 2/2000 |
| CN | 1383027 | 12/2002 |
| EP | 1445802 A1 * | 8/2004 |
| JP | 01-144682 | 6/1989 |
| JP | 02-049470 A | 2/1990 |
| JP | 06-188265 | 7/1994 |
| JP | 10-082997 | 3/1998 |
| JP | 11-103063 A | 4/1999 |
| JP | 11-163362 | 6/1999 |
| JP | 11-266020 A | 9/1999 |
| JP | 2001-324725 | 11/2001 |

(Continued)

*Primary Examiner* — Hung Vu
(74) *Attorney, Agent, or Firm* — Innovation Counsel LLP

(57) ABSTRACT

A thin film transistor substrate includes a base substrate, a gate electrode, a gate insulating layer, a surface treating layer, an active layer, a source electrode and a drain electrode. The gate electrode is formed on the base substrate. The gate insulating layer is formed on the base substrate to cover the gate electrode. The surface treating layer is formed on the gate insulating layer by treating the gate insulating layer with a nitrogen-containing gas to prevent leakage current. The active layer is formed on the surface treating layer to cover the gate electrode. The source electrode and the gate electrode that are spaced apart from each other by a predetermined distance are formed on the active layer.

9 Claims, 17 Drawing Sheets

(56) References Cited

FOREIGN PATENT DOCUMENTS

| | | |
|---|---|---|
| JP | 2001-339072 | 12/2001 |
| JP | 2002-341367 | 11/2002 |
| JP | 2005-222065 | 8/2005 |
| KR | 100237004 B1 | 10/1999 |
| TW | 430995 B | 4/2001 |

* cited by examiner

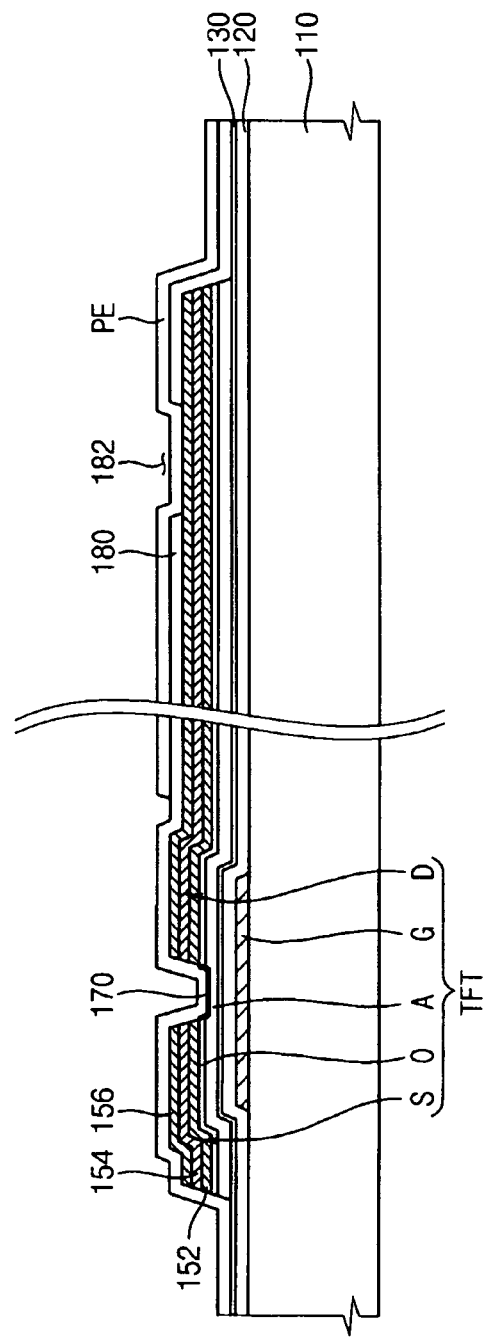

THIN FILM TRANSISTOR SUBSTRATE FOR DISPLAY PANEL

CROSS-REFERENCE TO RELATED APPLICATIONS

This application is a divisional application of U.S. patent application Ser. No. 11/646,126 filed on Dec. 27, 2006, which claims priority to Korean Patent Application No. 10-2005-0131967 filed on Dec. 28, 2005, the contents of the prior applications being herein incorporated by reference.

FIELD OF THE INVENTION

The present invention relates to a thin film transistor substrate, a method of manufacturing the thin film transistor substrate and a display panel having the thin film transistor substrate.

DESCRIPTION OF THE RELATED ART

While in general, flat-panel displays can be liquid crystal, plasma, field emission, electro luminescence, etc., the liquid crystal display because of its light weight, lower power consumption and lower driving voltage have made it very popular in various industrial fields. The liquid crystal display panel displays an image by using the light transmittance of the liquid crystal molecule and a backlight assembly that provides a source of light. The liquid crystal display panel includes an array substrate having a thin film transistor substrate, a color filter substrate and a liquid crystal layer between the array substrate and the color filter substrate. The array substrate includes a plurality of gate lines, a plurality of data lines and a plurality of pixels defined by the gate lines and the data lines. Each of the pixels includes a thin film transistor and a pixel electrode. The thin film transistor includes a source electrode, a drain electrode, a gate electrode, an active layer and an ohmic contact layer.

In general, the active layer of the thin film transistor generates an electron hole pair by means of a light energy. In particular, when light generated by the backlight assembly is incident onto the thin film transistor, an electron hole pair is generated in the active layer. When a negative gate voltage is applied to the gate electrode, the hole that is generated in the active layer acts as a leakage current causing a shadow on the screen of the display panel, thereby decreasing the quality of the display.

SUMMARY OF THE INVENTION

The present invention provides a thin film transistor substrate capable of improving image display quality by preventing active layer leakage current. In one aspect of the present invention, a thin film transistor substrate includes a base substrate, a gate electrode formed on the base substrate, a gate-insulating layer to cover the gate electrode, a first surface-treating layer formed by treating the gate-insulating layer with a nitrogen-containing gas, an active layer formed on a first surface-treating layer to cover the gate electrode, a source electrode and a drain electrode formed on the active layer spaced apart from each other. The thin film transistor substrate may further include a second surface-treating layer formed on the active layer between the source electrode and the drain electrode by treating the active layer with a nitrogen-containing gas so that the upper surface portion of the active layer may be nitrified to prevent leakage current.

BRIEF DESCRIPTION OF THE DRAWINGS

The above and other advantages of the present invention may become more apparent from a reading of the ensuing description together with the drawing, in which:

FIGS. 3A to 3C are cross-sectional views taken along a line I-I' in FIG. 2;

DESCRIPTION OF THE EMBODIMENTS

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Display Panel

Figure 1:
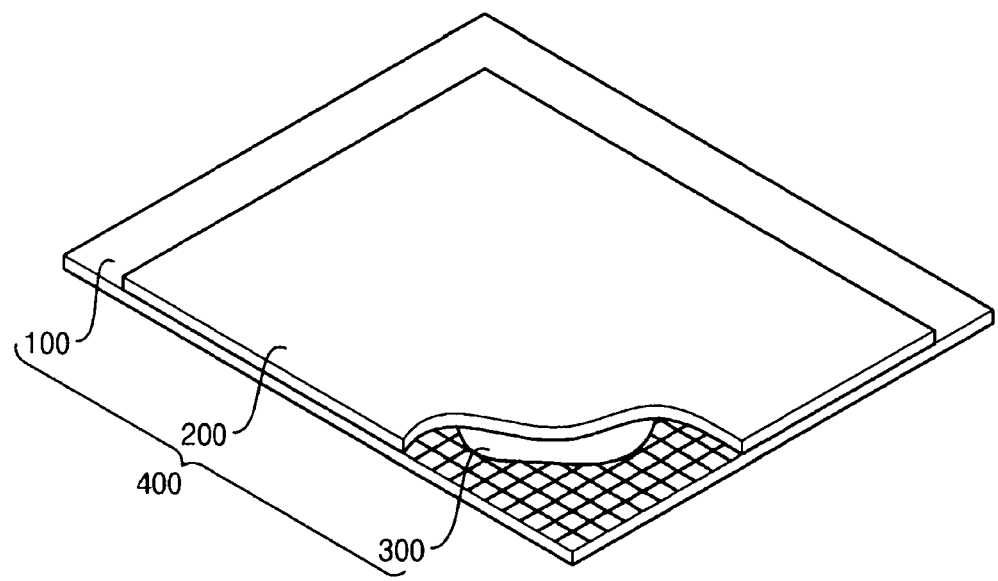
FIG. 1 is a perspective view illustrating a display panel according to an example embodiment of the present invention.

FIG. 1 is a perspective view illustrating a display panel according to an example embodiment of the present invention. Referring to FIG. 1, a display panel 400 includes a first substrate 100, a second substrate 200 and a liquid crystal layer 300, and displays an image by using a light. The first substrate 100 includes a plurality of pixel electrodes arranged in a matrix configuration, a plurality of thin film transistors applying a driving voltage to the pixel electrodes, respectively, and a plurality of signal lines to operate the thin film transistors.

The second substrate 200 faces the first substrate 100. The second substrate 200 includes a common electrode facing the first substrate 100 and a plurality of color filters facing the pixel electrodes. The color filters include a red color filter selectively transmitting a red light, a green color filter selectively transmitting a green light and a blue color filter selectively transmitting a blue light.

Liquid crystal layer 300 is disposed between the first substrate 100 and the second substrate 200. The liquid crystal molecules in layer 300 are rearranged by the electric field formed between the pixel electrode and the common electrode. The rearranged liquid crystals control the transmittance of light passing through the color filters so that an image is displayed.

Figure 2:
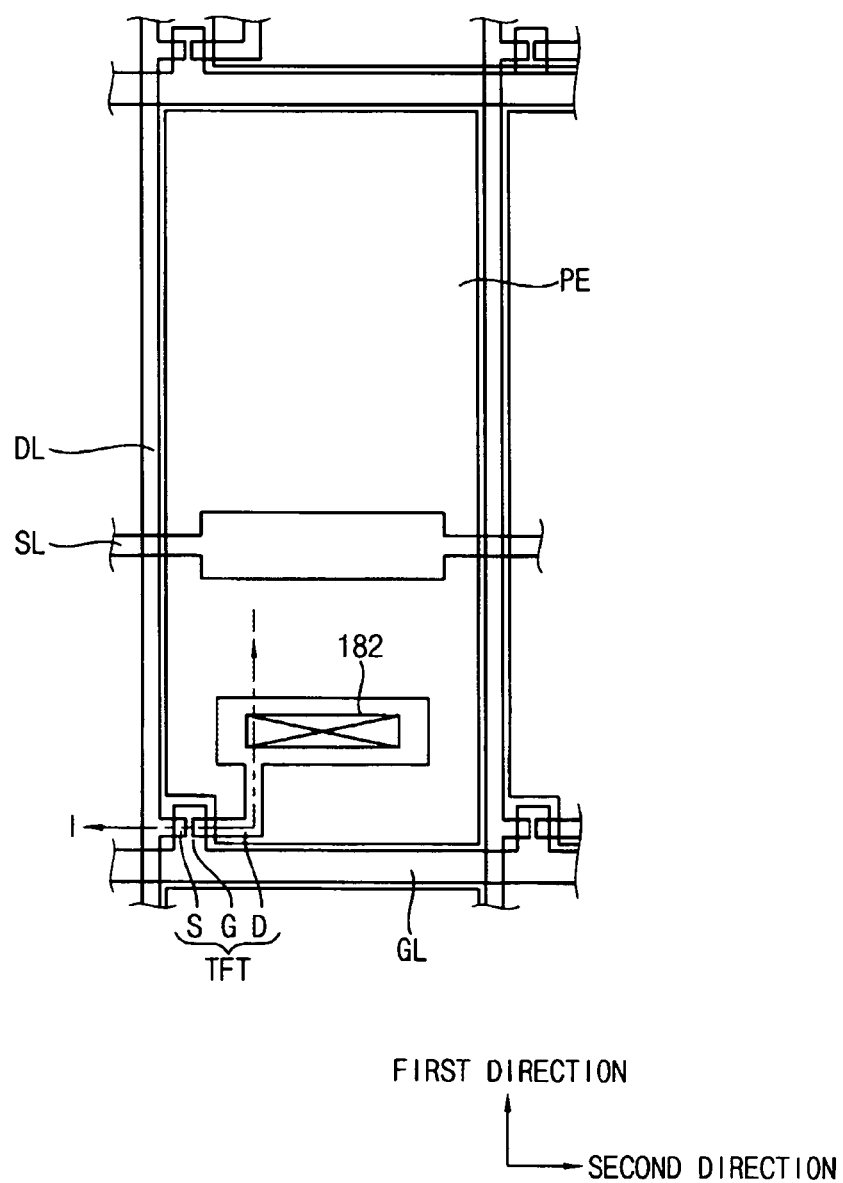
FIG. 2 is a plan view illustrating a pixel of the first substrate illustrated in FIG. 1.

Referring to FIG. 2, the first substrate 100 includes a plurality of data lines DL, a plurality of gate lines GL, a plurality of pixel electrodes 140, a plurality of thin film transistors TFT and a plurality of storage lines SL. Data lines DL extend in a first direction and are arranged substantially in parallel with each other in a second direction. The data line is electrically connected to the thin film transistor TFT to apply a data signal to the thin film transistor TFT.

Gate lines GL extend in a second direction to cross data lines DL and are arranged substantially in parallel with each other in the first direction. For example, the first direction is substantially in perpendicular to the second direction. A plurality of pixels is defined by data lines DL and gate lines GL crossing each other. A thin film transistor TFT and a pixel electrode PE are formed at each of the pixels.

Each of thin film transistors TFTs includes a gate electrode G, a source electrode S, a drain electrode D, an active layer (not shown) and an ohmic contact layer (not shown).

Gate electrode G branches from one of gate lines GL in a first direction. The active layer is formed on gate electrode G to cover the gate electrode G. Source electrode S branches from one portion of data lines DL in a second direction, and is formed to overlap a portion of gate electrode G. Drain electrode D is spaced apart from source electrode S by a predetermined distance to face the source electrode S and to overlap a portion of gate electrode G. For example, a portion of drain electrode D extends in the first direction and a remaining portion of drain electrode D extends in a second direction, and the portion of drain electrode D is electrically connected to pixel electrode PE via a contact hole 182. An ohmic contact layer is formed between the active layer and the source electrode S and between the active layer and drain electrode D to reduce contact resistance.

Pixel electrode PE is formed at each of the pixels and includes a transparent conductive material. Pixel electrode PE is electrically connected to drain electrode D via contact hole 182. The driving voltage that is applied from thin film transistor TFT to pixel electrode PE charges the liquid crystal capacitor at pixel electrode PE. The transparent conductive materials that can be used for pixel electrode PE include, alone or in a combination, indium tin oxide (ITO), indium zinc oxide (IZO), amorphous indium tin oxide (a-ITO), etc.

Storage lines SL are formed below pixel electrode PE and are substantially in parallel with gate lines GL. Each storage line SL includes a storage electrode formed at each of the pixels. Alternatively, each of the storage lines SL may include a plurality of storage electrodes. A ground voltage that is provided from an exterior to the first substrate 100 is applied to storage line SL. The storage electrode is spaced apart from pixel electrode PE to form a storage capacitor. The storage capacitor maintains a voltage difference between pixel electrode PE and a common electrode of a second substrate facing the first substrate 100.

Figure 3B:
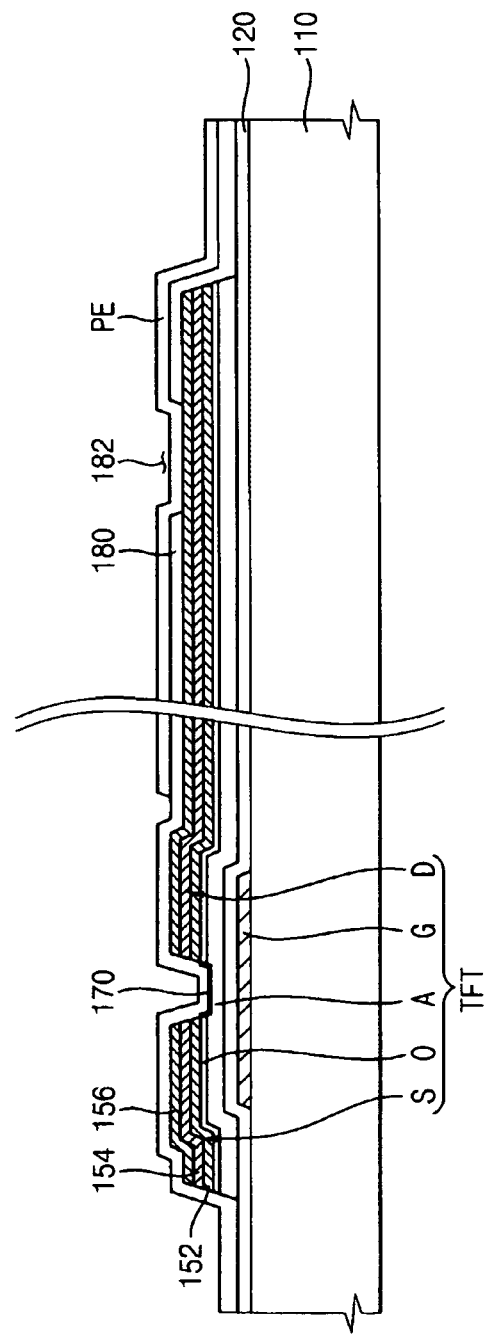
Figure 3C:
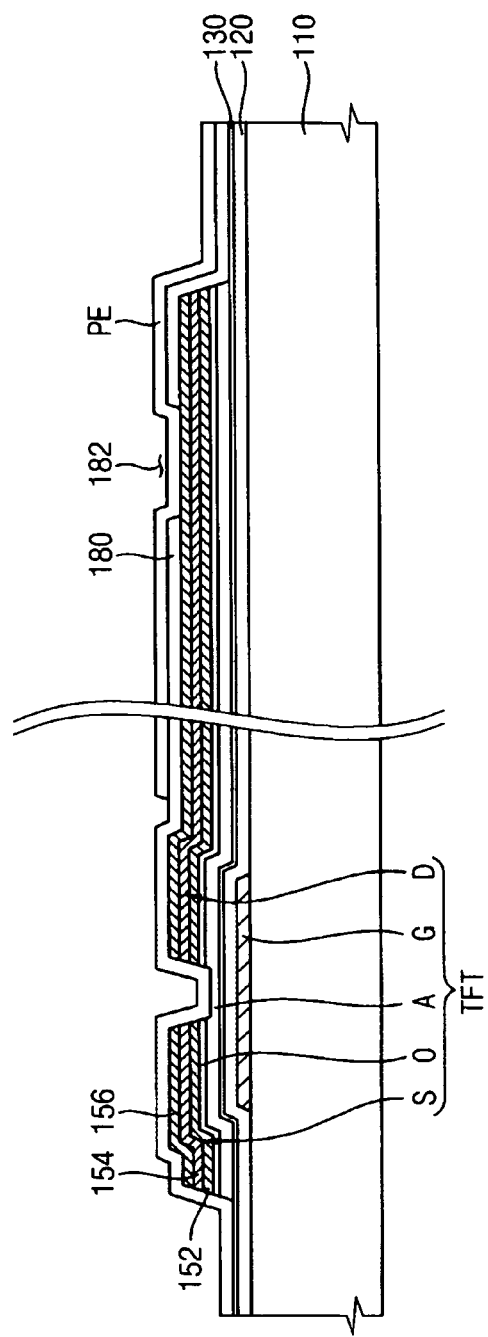

FIGS. 3A to 3C are cross-sectional views taken along a line I-I' in FIG. 2. Referring to FIGS. 2 and 3A, the first substrate 100 includes a transparent substrate 110, a gate line GL, a storage line SL, a gate insulating layer 120, a first surface treating layer 130, a data line DL, a thin film transistor TFT, a second surface treating layer 170, a protecting layer 180 and a pixel electrode PE. The thin film transistor TFT includes a gate electrode G, a source electrode S, a drain electrode D, an active layer A and an ohmic contact layer O.

The transparent substrate 110 has a plate-shape and includes a transparent material. For example, the transparent substrate 110 may include glass, quartz, sapphire or a synthetic resin such as polyester, polyacrylate, polycarbonate, polyether ketone, etc.

Gate line GL is formed on the transparent substrate 110 in the second direction. Storage line SL is formed on the transparent substrate 110 in the second direction. The gate electrode G is branched from gate line GL in the first direction.

The gate insulating layer 120 is formed on the transparent substrate 110 to cover gate line GL, gate electrode G and storage line SL. For example, gate insulating layer 120 includes an insulating material such as silicon nitride ($SiN_x$), silicon oxide ($SiO_2$), etc.

The first surface treating layer 130 is formed by treating a surface of gate insulating layer 120 with a nitrogen-containing gas. The thickness of first surface treating layer 130 may be about 15 Å to about 25 Å. First surface treating layer 130 reduces "dangling bonds" formed on a surface of the gate insulating layer 120, i.e., the outermost electrons missing a neighbor to which the outermost electrons are cable of binding. Dangling bonds are defects that disrupt the flow of electrons.

Active layer A is formed on the first surface treating layer 130 to cross the gate electrode G. For example, active layer A includes an amorphous silicon (a-Si).

N+ impurities are implanted into the amorphous silicon layer at a high concentration to form the ohmic contact layer O. A central portion of ohmic contact layer O is removed so that the ohmic contact layer O is divided into two separate portions.

Data line DL extends in a first direction on ohmic contact layer O. Source electrode S extends in the second direction from the data line DL on ohmic contact layer O and overlaps a portion of gate electrode G.

Drain electrode D is formed on the ohmic contact layer O and is spaced apart from the source electrode S by a predetermined distance to overlap a portion of gate electrode G. Drain electrode D may extend into pixel electrode PE.

As the above mentioned, ohmic contact layer O and active layer A are formed under the data line DL, the source electrode S and drain electrode D. Alternatively, the ohmic contact layer O and the active layer A may be formed so as to correspond to gate electrode G.

Source electrode S and drain electrode D may be formed from a first metal layer 152, a second metal layer 154 and a third metal layer 156. For example, the first, second and third metal layers 152, 154 and 156 may be a molybdenum layer, an aluminum layer and a molybdenum layer, respectively.

A second surface treating layer 170 is formed on the active layer A between the source electrode S and drain electrode D, and is formed by treating a surface of the active layer A with a nitrogen-containing gas. The second surface treating layer 170 includes silicon nitride ($SiN_x$). The thickness of the second surface treating layer 170 may be about 15 Å to about 25 Å. For example, the second surface treating layer 170 reduces dangling bonds formed on a surface of the active layer A.

A protecting layer 180 is formed on the base substrate having the second surface treating layer 170 to cover the thin film transistor TFT and to protect the thin film transistor TFT from external heat or moisture. A contact hole 182, through which a portion of the protecting layer 180 is exposed, is formed on drain electrode D. For example, the protecting layer 180 includes silicon oxide SiO2 that is transparent.

Pixel electrode PE is formed on the protecting layer 180 and is electrically connected to drain electrode D.

As mentioned above, the first substrate 100 including the first surface treating layer 130 and the second surface treating layer 170 is illustrated in FIG. 3A. Particularly, the first surface treating layer 130 is formed between the gate insulating layer 120 and the active layer A, and the second surface-treating layer 180 is formed on the active layer A.

However, referring to FIGS. 3B and 3C, either of the first surface treating layer 130 or the second surface treating layer 170 may be omitted. The first substrate 100 without the second surface treating layer 170 is illustrated in FIG. 3B. The first substrate 100 without the first surface treating layer 130 is illustrated in FIG. 3C.

Figure 4:
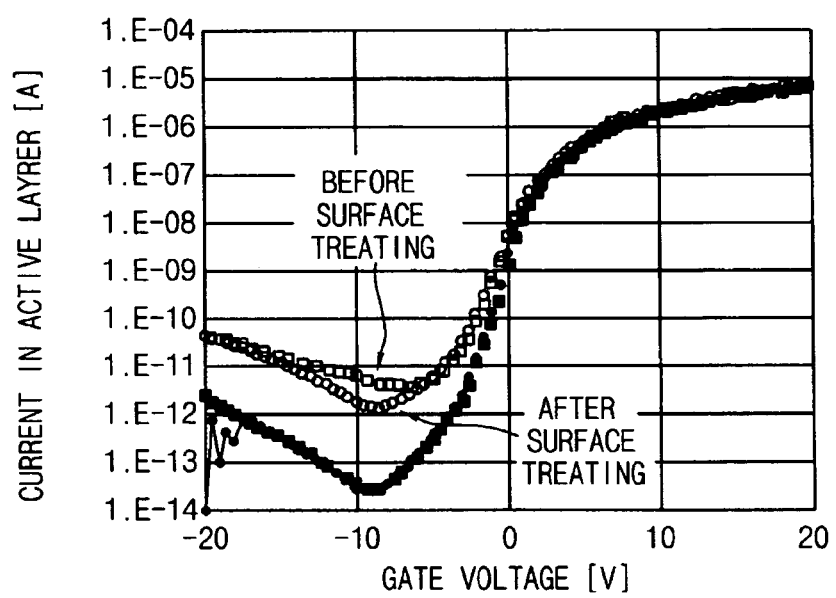
FIG. 4 is a graph illustrating variation of characteristics of a thin film transistor according to a surface treatment of an active layer with a nitrogen-containing gas.

FIG. 4 is a graph illustrating variation of characteristics of the thin film transistor according to the surface treatment of the active layer with a nitrogen-containing gas. Particularly, FIG. 4 is a graph illustrating variation of a current in the active layer in response to variation of gate voltage. The black spots represent data values measured when a light is not radiated onto the active layer. The white spots represent data values measured when a light is radiated onto the active layer. The white tetragonal spots represent data values measured before the surface of the active layer is treated with a nitrogen-containing gas. The white circular spots represent data values measured after the surface of the active layer is treated with a nitrogen-containing gas.

Referring to FIG. 4, when light is not radiated onto the active layer A and a positive gate voltage is applied to the gate electrode G, no more than about $10^{-5}$ A of current flows through the active layer A. When light is not irradiated onto the active layer A and a negative gate voltage is applied to the gate electrode G, no less than about $10^{-14}$ A of current flows through the active layer A. The current value in the active layer A when the surface of the active layer is treated with a nitrogen-containing gas is substantially same as the current value in the active layer A when the surface of the active layer is not treated with a nitrogen-containing gas. Since $10^{-14}$ A of current is relatively very small, the leakage current is negligible.

In contrast, when light is irradiated onto the active layer A and a positive gate voltage is applied to the gate electrode G, no more than about $10^{-5}$ A of current flows through the active layer A. When light enters the active layer A and a negative gate voltage is applied to the gate electrode G, no less than about $10^{-12}$ to about $10^{-11}$ A of current flows through the active layer A. The current in the active layer A is no less than about $10^{-11}$ A, before the surface of the active layer is treated with a nitrogen-containing gas. The current in the active layer A is about $10^{-12}$ A, after the surface of the active layer is not treated with a nitrogen-containing gas. It can be noted that the current of the active layer, of which the surface is treated with a nitrogen-containing gas, is smaller than the current of the active layer, of which the surface is not treated with a nitrogen-containing gas.

As the above mentioned, the surface of the gate insulating layer 120 or the active layer A is treated with a nitrogen-containing gas to form the first surface treating layer 130 or the second surface treating layer 170. Thus, a leakage current in the active layer A may be prevented.

Particularly, light is irradiated onto the active layer A to generate an electron hole pair in the active layer A. The electron and/or the hole is combined with a dangling bond formed at an interface of the active layer A to generate a leakage current in the active layer A. The first surface treating layer 130 or the second surface treating layer 170 reduces the dangling bonds to prevent the electron and/or the hole from being combined with the dangling bond. Thus, the leakage current in the active layer A is decreased so that shading at a screen of the liquid display panel 400 is decreased.

Method of Manufacturing a Thin Film Transistor Substrate

Figure 5:
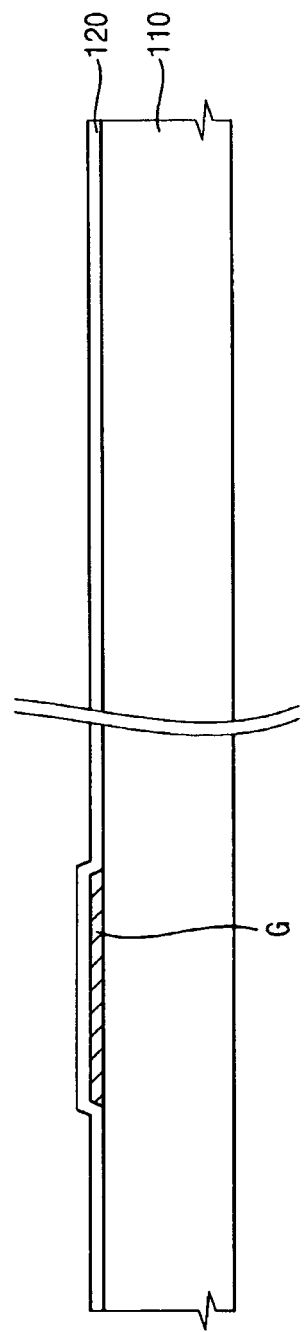
FIGS. 5 to 15 are cross-sectional views illustrating a method of manufacturing a thin film transistor substrate according to an example embodiment of the present invention.

Referring to FIGS. 2 and 5, a gate electrode G is formed on a transparent substrate 110. A gate line GL and a storage line SL are simultaneously formed on the transparent substrate 110 when forming the gate electrode G. For example, a metal layer formed on the transparent substrate 110 via a sputtering process is patterned via a photolithography process so to form the gate electrode G, gate line GL and storage line SL. For example, each of the gate electrode G, gate line GL and storage line SL may include an aluminum-neodymium/molybdenum double layer.

A gate insulating layer 120 is formed to cover the gate electrode G, gate line GL and storage line SL. For example, the gate insulating layer 120 is formed by a plasma enhanced chemical vapor deposition (PECVD) method, and includes nitride silicon (SiNx).

Figure 6:
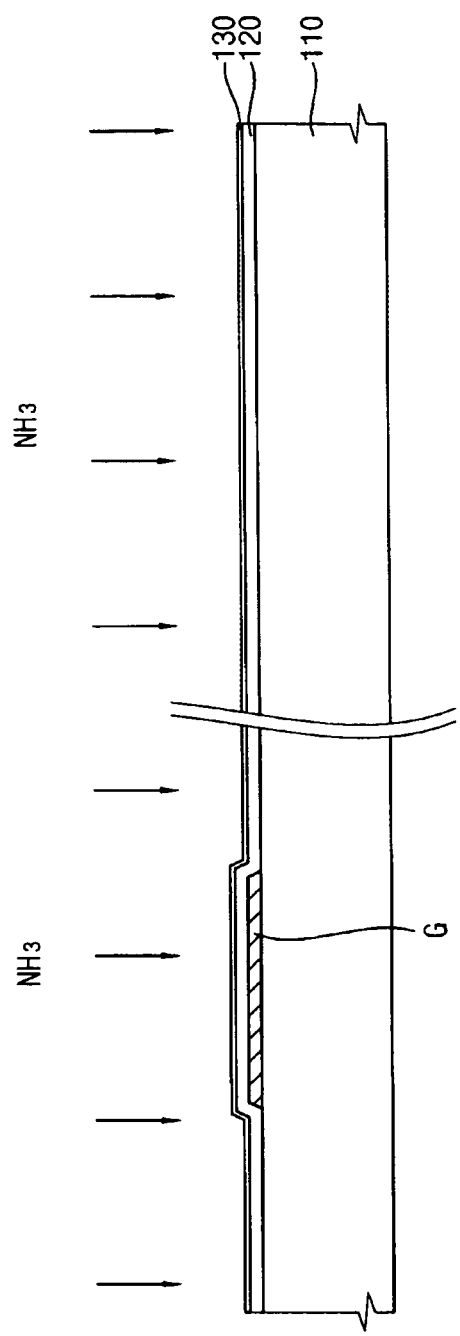

Referring to FIGS. 2 and 6, after the gate insulating layer 120 is formed, a surface of the gate insulating layer 120 is treated and cleaned with a nitrogen-containing gas so that dangling bonds formed at the surface of the gate insulating layer 120 may be reduced.

Examples of the nitrogen-containing gas that can be used for treating the surface of the gate insulating layer 120 include ammonia ($NH_3$), nitrogen ($N_2$), etc. Preferably, the nitrogen-containing gas may be ammonia gas ($NH_3$). The nitrogen-containing gas may be in a state of plasma to increase reactivity between the surface of the gate insulating layer 120 and the nitrogen-containing gas.

A first surface treating layer 130 is formed at the surface of the gate insulating layer 120 by the treating the surface of the gate insulating layer 120. A thickness of the first surface treating layer 130 is varied according to a time, for which the treating is performed, and may be about 15 Å to about 25 Å.

Figure 7:
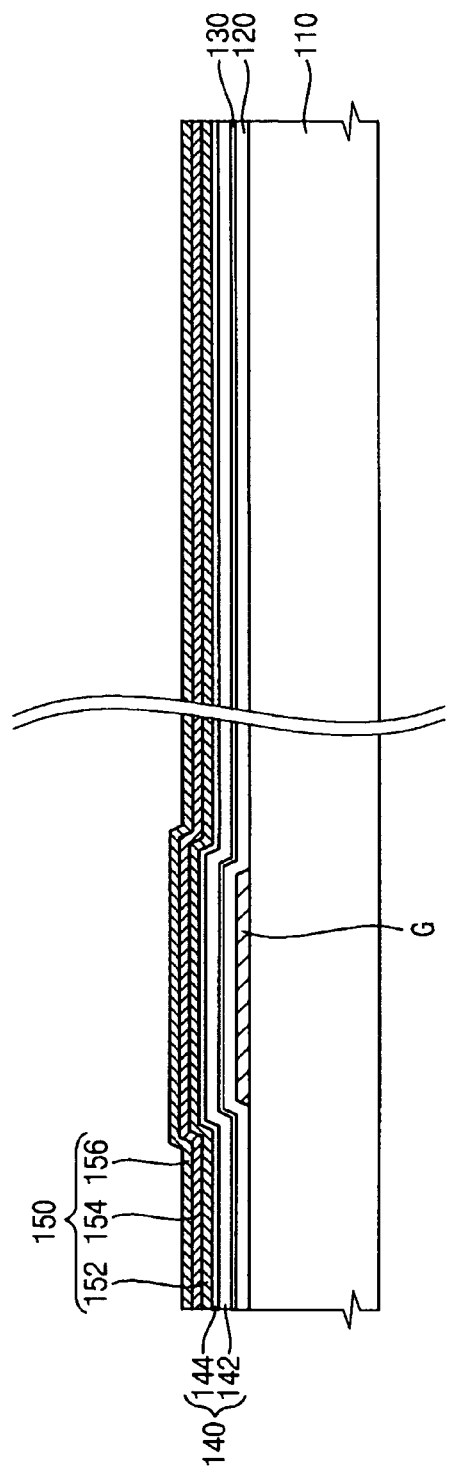

Referring to FIGS. 2 and 7, after the surface of the gate insulating layer 120 is treated with the nitrogen-containing gas, a semiconductor layer 140 is formed on the first surface treating layer 130. For example, the semiconductor layer 140 is formed by a plasma enhanced chemical vapor deposition (PECVD) method.

The semiconductor layer 140 may include a first semiconductor layer 142 and a second semiconductor layer 144. For example, the first semiconductor layer 142 includes amorphous silicon, and the second semiconductor layer 144 includes highly doped amorphous silicon.

A metal layer 150 is formed on the semiconductor layer 140. For example, the metal layer 150 is formed by a plasma enhanced chemical vapor deposition (PECVD) method. The metal layer 150 may include a first metal layer 152, a second metal layer 154 and a third metal layer 156. For example, the first to third metal layers may be a molybdenum layer, an aluminum layer and a molybdenum layer, respectively.

Figure 8:
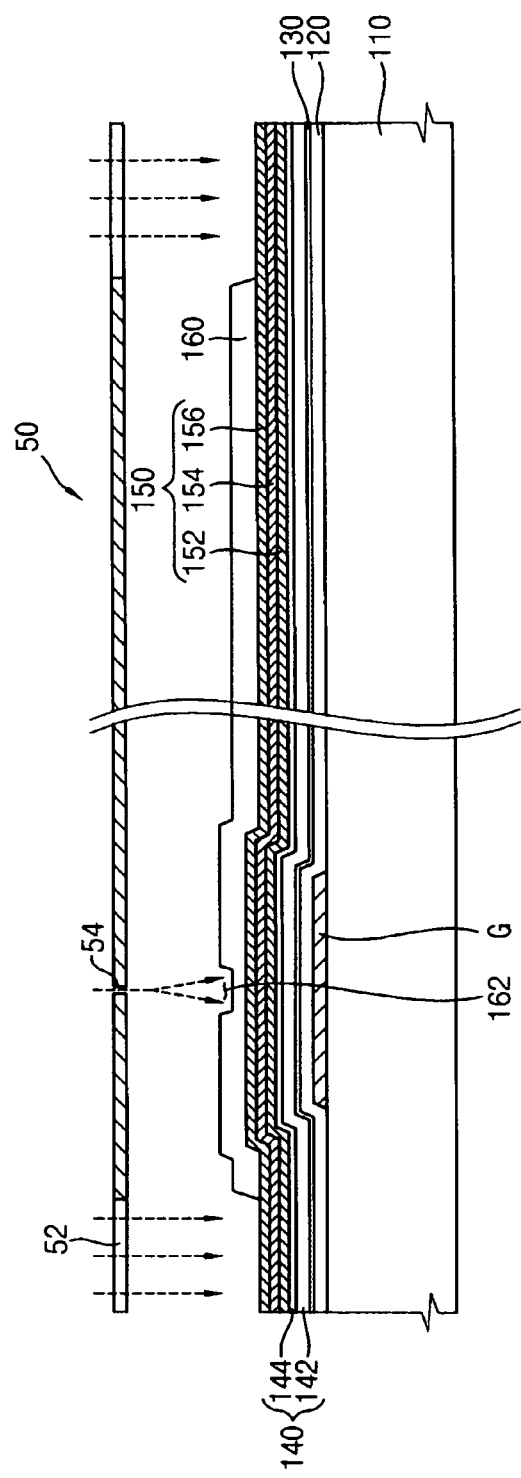

Referring to FIGS. 2 and 8, after the metal layer 150 is formed, a photoresist film (not shown) is formed on the metal layer 150. The photoresist film may include a negative photoresist.

The photoresist film is exposed to a light through a mask 50 and developed to form a photoresist pattern 160. The photoresist pattern 160 includes an electrode-forming groove 162 having a predetermined depth. The electrode-forming groove 162 may correspond to the gate electrode G.

Particularly, the mask 50 has a main opening 52 through which light passes and a slit portion 54 that diffracts the light passing through the slit portion 54. The light passing through the main opening 52 is irradiated onto the photoresist film to form the photoresist pattern 160. The light diffracted by the slit portion 54 is irradiated onto the photoresist film to form the electrode-forming groove 162 at the photoresist pattern 160.

Figure 9:
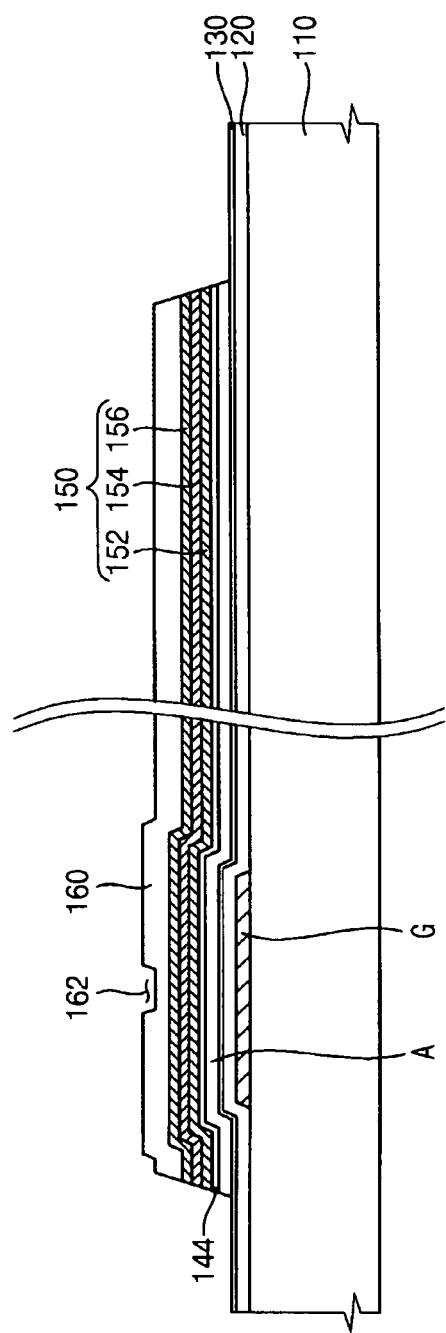

Referring to FIGS. 2 and 9, after the photoresist pattern 160 is formed, a portion of the metal layer 150 is removed using the photoresist pattern 160. In particular, a portion of the first to third metal layers 152, 154 and 156, on which the photoresist pattern is not formed, is etched using an etching solution so that a data line DL is formed.

A portion of the semiconductor layer 140 is removed using the remained metal layer 150. In particular, a portion of the first and second semiconductor layers 142 and 144 is dry-etched using the remaining metal layer 150 as an etching mask. For example, the dry-etching process is performed by ions generated by plasma discharging. A portion of a remaining first semiconductor layer 142 forms an active layer A.

Figure 10:
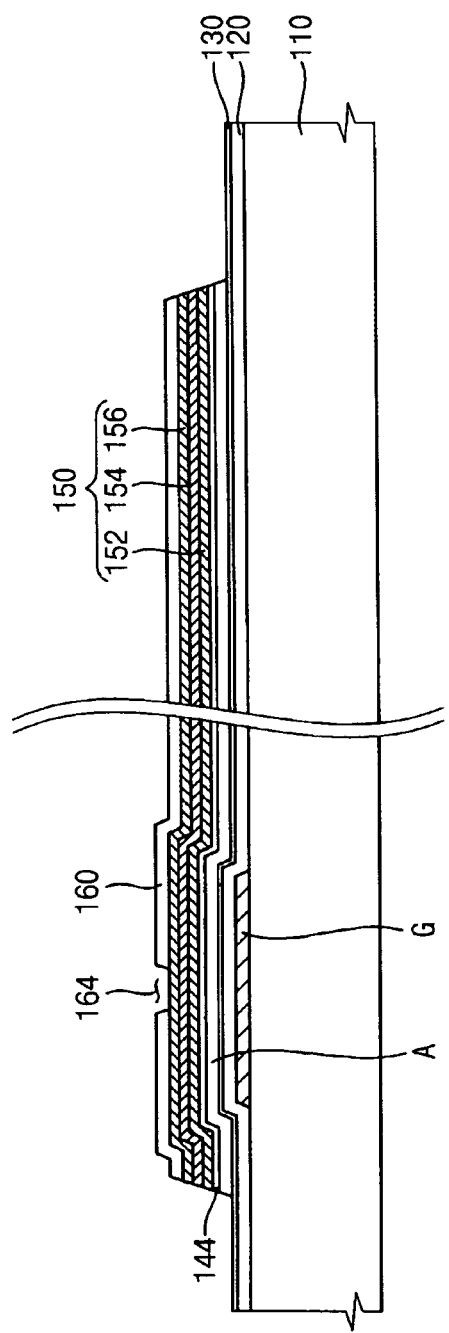

Referring to FIGS. 2 and 10, after the portion of the semiconductor layer 140 is removed, the thickness of the photoresist pattern 160 including the electrode-forming groove 162 is reduced by oxidizing the photoresist pattern 160 to a uniform thickness. Thus, an electrode-forming hole 164 is formed to expose an upper surface of the metal layer 150.

Figure 11:
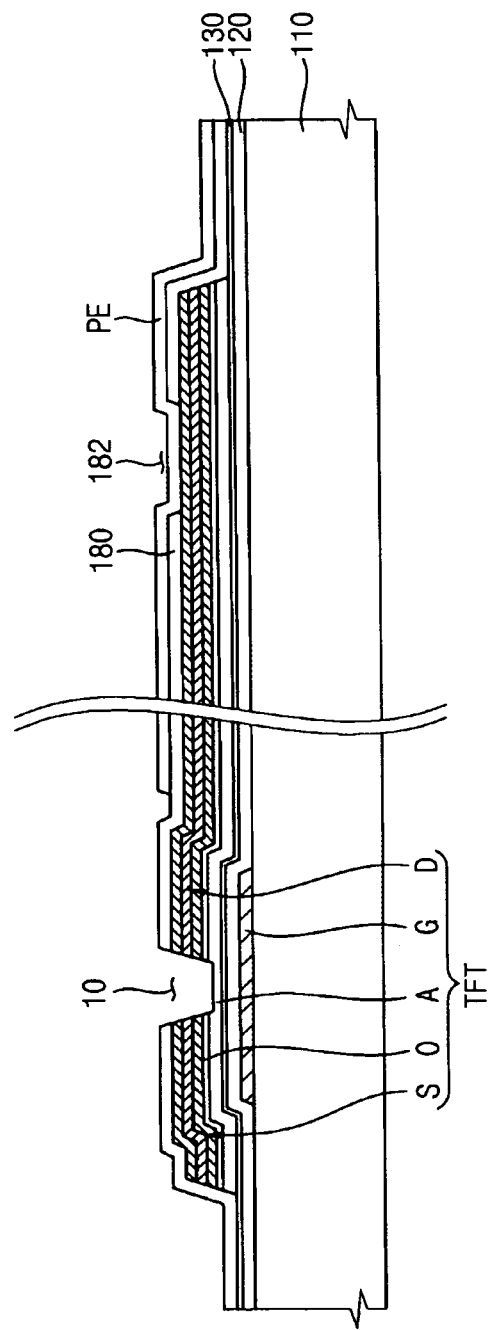

Referring to FIGS. 2 and 11, after the electrode-forming hole 164 is formed, a portion of the metal layer 150 is removed using the remaining photoresist pattern 160. In particular, an etching solution is applied to the metal layer 150 through the electrode-forming hole 164 to etch the metal layer 150 using the remaining photoresist pattern 160 as an etching mask. As a result, the metal layer 150 is divided into two separate portions to form a source electrode S and a drain electrode D.

A portion of the second semiconductor layer 144 is removed using the remaining metal layer 150. When the portion of the second semiconductor layer 144 is removed, a thickness of the active layer A may be reduced. According to the above, a portion of an upper surface of the active layer A is exposed. An ohmic contact layer O is formed between the active layer A and the source electrode S, and between the active layer A and drain electrode D. The portion of the second semiconductor layer 144 may be removed by using ions generated by plasma discharging.

As the above mentioned, the metal layer 150 and the second semiconductor layer 144 are divided into two separate portions so that a separating groove 10 is formed between the source electrode S and drain electrode D.

Figure 12:
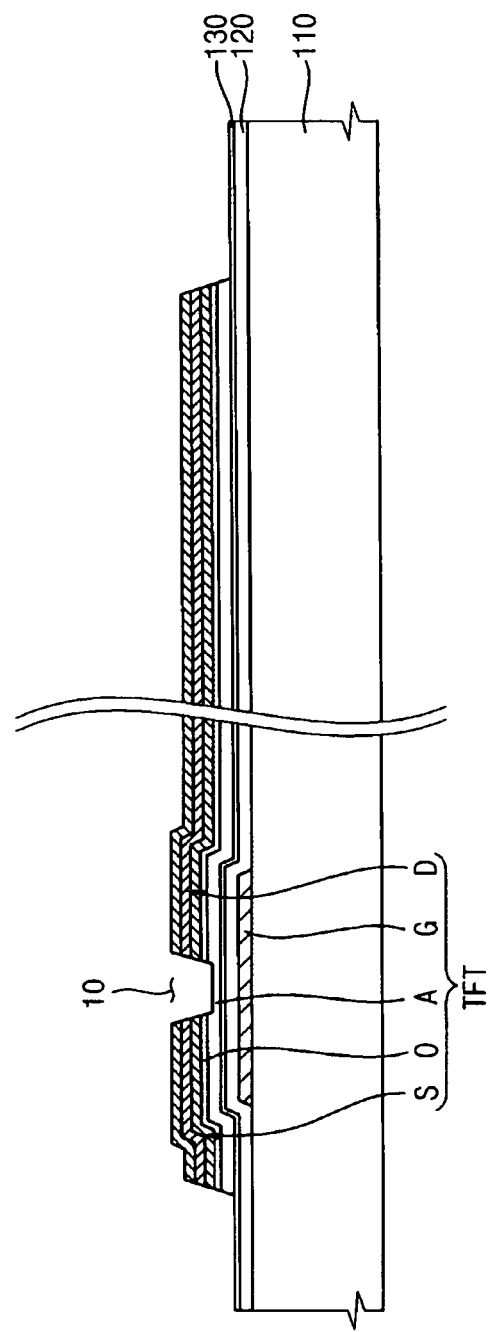

Referring to FIGS. 2 and 12, after the source electrode S and drain electrode D are formed, the remaining photoresist pattern 160 is completely removed. The remaining photoresist pattern 160 may be removed by using a plasma oxidizing process.

Figure 13:
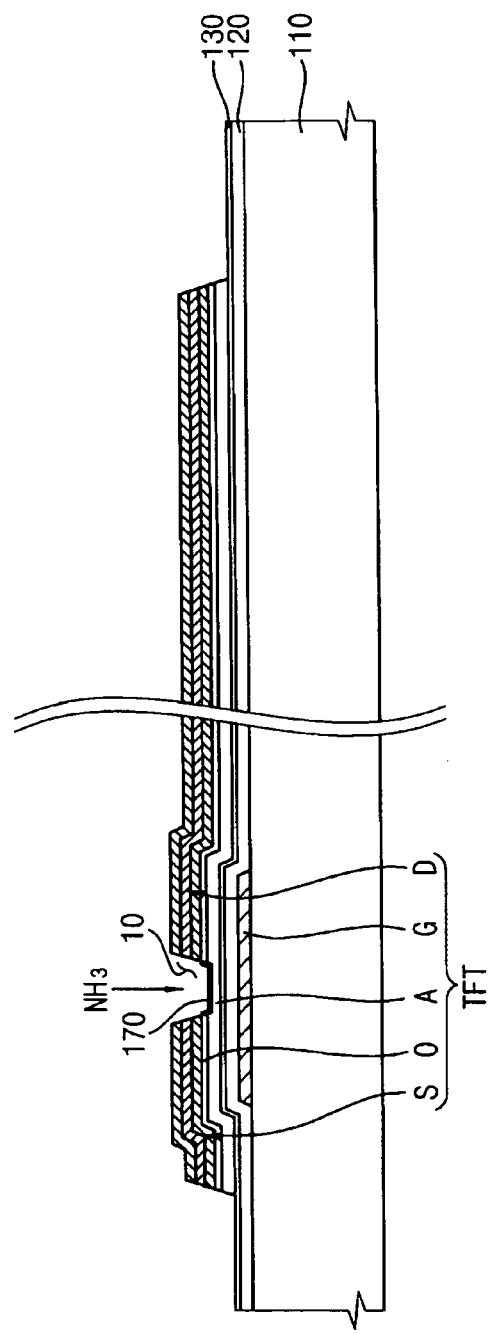

Referring to FIG. 13, after the remaining photoresist pattern 160 is completely removed, an upper surface of the active layer A is treated with a nitrogen-containing gas applied to the upper surface of the active layer A through the separating groove 10. Thus, dangling bonds formed on the surface of the active layer A may be reduced, and the second surface treating layer 170 may be formed.

The nitrogen-containing gas may include ammonia (NH$_3$), etc. The nitrogen-containing gas may be in a state of plasma. An upper surface of the active layer A may be surface-treated with the nitrogen-containing gas to decrease dangling bonds on the surface of the active layer A.

Figure 14:
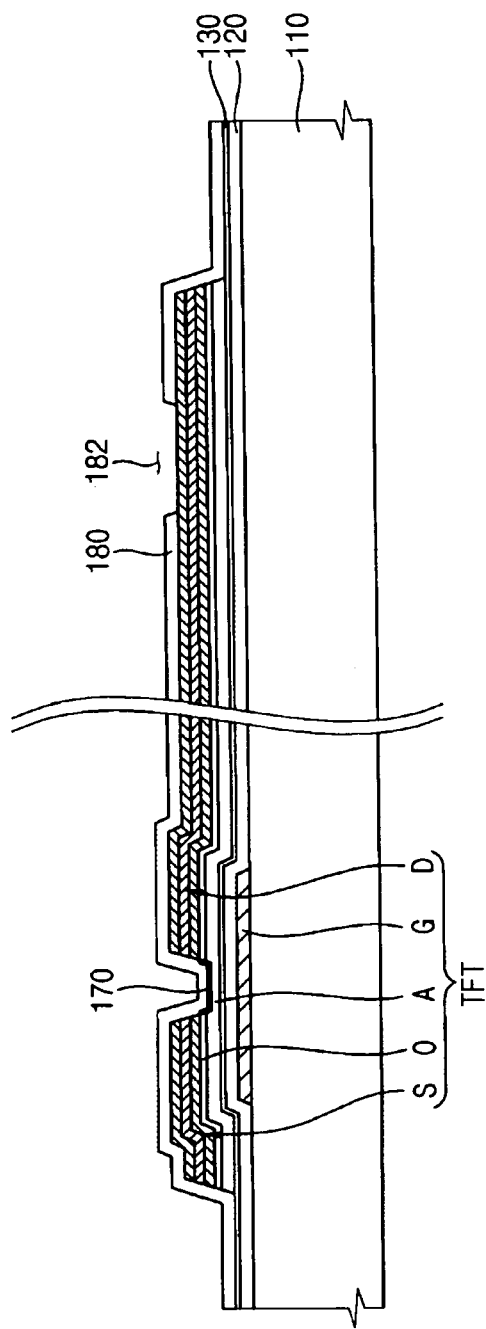

Referring to FIGS. 2 and 14, after the upper surface of the active layer A is treated with a nitrogen-containing gas, a protecting layer 180 is formed on the base substrate having the second surface treating layer 170. A portion of the protecting layer 180 is removed via a photolithography process to form a contact hole 182. The portion of the protecting layer 180 may be removed by a dry-etching process. The contact hole 182 is formed on a portion of drain electrode D that extends to a pixel region in which a pixel electrode PE (shown in FIG. 15) is formed.

Figure 15:
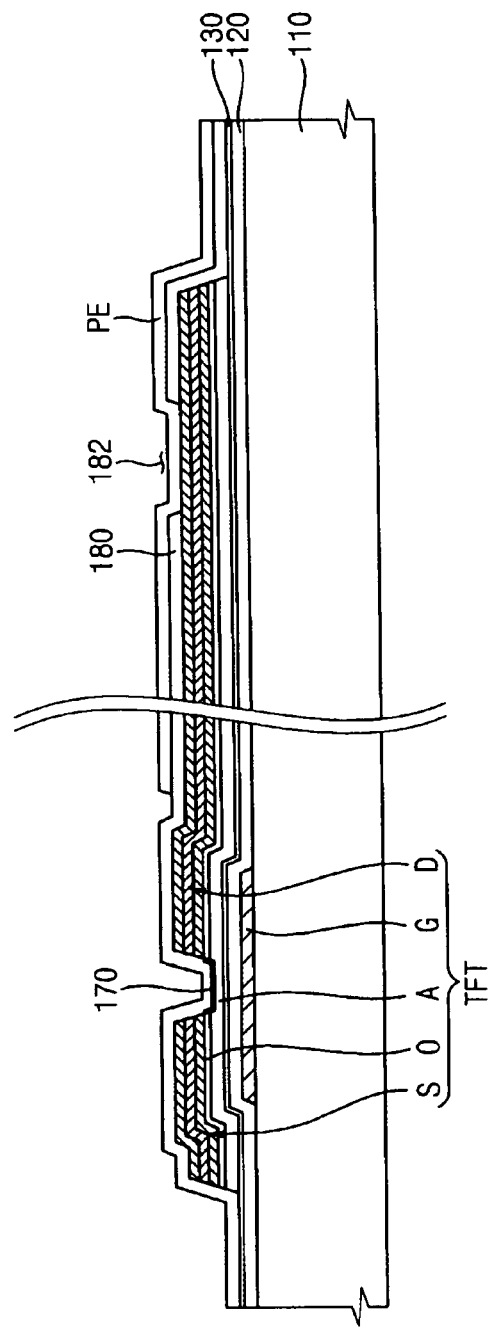

Referring to FIGS. 2 and 15, after the protecting layer 180 and the contact hole 182 are formed, a transparent conductive material (not shown) is disposed on the protecting layer 180. A portion of the transparent conductive material is removed to form a pixel electrode PE. The portion of the transparent conductive material may be removed by a wet-etching process. Pixel electrode PE is electrically connected to drain electrode D via the contact hole 182 of the protecting layer 180.

According to this exemplary embodiment, the surface of the gate insulating layer 120 or the active layer A is treated with a nitrogen-containing gas to form the first surface treating layer 130 or the second surface treating layer 170. Thus, a leakage current in the active layer A may be decreased.

Particularly, the first surface treating layer 130 or the second surface treating layer 170 reduces the dangling bonds formed at an interface of the active layer A. When the dangling bonds are decreased at the interface of the active layer A, the electrons and/or the holes combined with the dangling bond are decreased. Thus, the leakage current in the active layer A may be decreased.

In this exemplary embodiment, the upper surfaces of the gate insulating layer 120 and the active layer A are treated with a nitrogen-containing gas, respectively. However, the upper surface of only the gate insulating layer 120 may be treated with the nitrogen-containing gas, or the upper surface of only the active layer A may be treated with the nitrogen-containing gas.

Furthermore, in this exemplary embodiment, 4-mask process is used. In the 4-mask process, the first substrate 100 is formed using four masks. However, the number of the masks may be easily changed by one ordinary skilled in the art.

According to the thin film transistor substrate, a method of manufacturing the thin film transistor substrate and a display panel having the thin film transistor substrate, a surface-treating layer is formed at an upper surface or a lower surface of an active layer to prevent a leakage current in the active layer. Thus, shading at a screen of the display panel is prevented so that a display quality of an image is improved.

Although the exemplary embodiments of the present invention have been described, it is to be understood that various changes and modifications will be apparent to those skilled in the art and may be made without, however, departing from the spirit and scope of the present invention.

What is claimed is:
1. A thin film transistor substrate comprising:
a base substrate;
a gate electrode formed on the base substrate;
a gate insulating layer including at least one of silicon nitride (SiNx) and silicon oxide (SiO$_2$) formed on the base substrate to cover the gate electrode;
a first surface treating layer formed on the gate insulating layer by treating the gate insulating layer with a nitrogen-containing gas including ammonia;
an active layer formed on the first surface treating layer to cover the gate electrode, the active layer including amorphous silicon (a-Si); and a source electrode and a drain electrode spaced apart from the source electrode by a predetermined distance, the source and drain electrodes being formed on the active layer.

2. The thin film transistor substrate of claim 1, wherein the thickness of the first surface treating layer is about 15 Å to about 25 Å.

3. The thin film transistor substrate of claim 1, further comprising a second surface treating layer formed on the active layer between the source electrode and the drain electrode by treating the active layer with an additional nitrogen-containing gas.

4. The thin film transistor substrate of claim 3, wherein the thickness of the second surface treating layer is about 15 Å to about 25 Å.

5. The thin film transistor substrate of claim 1, further comprising an ohmic contact layer formed between the source electrode and the active layer, and between the drain electrode and the active layer.

6. The thin film transistor substrate of claim 5, wherein the ohmic contact layer comprises a highly ion-doped amorphous silicon.

7. The thin film transistor substrate of claim 1, wherein each of the source electrode and the drain electrode comprises a triple layer having a molybdenum layer, an aluminum layer and a molybdenum layer.

8. A display panel comprising:
a first substrate having a base substrate;
a gate electrode formed on the base substrate;
a gate insulating layer including at least one of silicon nitride (SiNx) and silicon oxide ($SiO_2$) formed on the base substrate to cover the gate electrode;
a first surface treating layer formed on the gate insulating layer by treating the gate insulating layer with a nitrogen-containing gas including ammonia;
an active layer formed on the first surface treating layer to cover the gate electrode, the active layer including amorphous silicon (a-Si); and
a source electrode and a drain electrode spaced apart from the source electrode by a predetermined distance, the source and drain electrodes being formed on the active layer;
a second substrate facing the first substrate; and
a liquid crystal layer between the first substrate and the second substrate.

9. The display panel of claim 8, further comprising a second surface treating layer formed on the active layer between the source electrode and the drain electrode by treating the active layer with an additional nitrogen-containing gas.

\* \* \* \* \*